(12) United States Patent
Huang et al.

(10) Patent No.: US 12,075,682 B2
(45) Date of Patent: Aug. 27, 2024

(54) DISPLAY DEVICE

(71) Applicants: Chengdu BOE Optoelectronics Technology Co., Ltd., Chengdu (CN); BOE Technology Group Co., Ltd., Beijing (CN)

(72) Inventors: Hao Huang, Beijing (CN); Fei Li, Beijing (CN); Yaqian Zhang, Beijing (CN); Xinpeng Wang, Beijing (CN); Xiaolong Zhu, Beijing (CN); Hengzhen Liang, Beijing (CN); Huan Meng, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 363 days.

(21) Appl. No.: 17/639,177

(22) PCT Filed: Feb. 2, 2021

(86) PCT No.: PCT/CN2021/074950
§ 371 (c)(1),
(2) Date: Feb. 28, 2022

(87) PCT Pub. No.: WO2021/190164
PCT Pub. Date: Sep. 30, 2021

(65) Prior Publication Data
US 2022/0328576 A1 Oct. 13, 2022

(30) Foreign Application Priority Data
Mar. 25, 2020 (CN) .......................... 202010220653.6

(51) Int. Cl.
*H01L 51/52* (2006.01)
*H10K 50/84* (2023.01)
(Continued)

(52) U.S. Cl.
CPC ........... *H10K 59/60* (2023.02); *H10K 50/841* (2023.02); *H10K 50/87* (2023.02); *H10K 59/12* (2023.02)

(58) Field of Classification Search
CPC ...... H10K 59/60; H10K 50/841; H10K 50/87; H10K 59/12; H10K 59/131; H10K 59/65; H10K 59/00; G02F 1/1333
See application file for complete search history.

(56) References Cited

U.S. PATENT DOCUMENTS

2017/0098796 A1    4/2017   Yee
2020/0267293 A1*   8/2020   Noh ..................... G06F 1/1626

FOREIGN PATENT DOCUMENTS

CN   108681131 A   10/2018
CN   109581745 A   4/2019
(Continued)

OTHER PUBLICATIONS

International Search Report and Written Opinion received for PCT Patent Application No. PCT/CN2021/074950, mailed on May 8, 2021, 10 pages (3 pages of English Translation and 7 pages of Original Document).

*Primary Examiner* — Donald L Raleigh
(74) *Attorney, Agent, or Firm* — Workman Nydegger

(57) ABSTRACT

A display device includes first and second camera regions, a function integrating region, and an ambient light sensing region. A display panel has a first through hole in the first camera region, a second through hole in the second camera region, and a non-display region between the through holes. A cover panel is provided on the display side of the display panel. A grid glue has an orthographic projection of the first openings of the two camera regions and has an area greater than an orthographic projection of the through holes. A rigid heat dissipating layer has a second opening in all the four adjacent regions, and an orthographic projection of the
(Continued)

second openings has an area greater than the orthographic projection of the first openings, and a photosensitive module defines an orthographic projection with an area greater than the orthographic projections of the first openings and the second openings.

15 Claims, 9 Drawing Sheets

(51) Int. Cl.
    *H10K 50/87*    (2023.01)
    *H10K 59/60*    (2023.01)
    *H10K 59/12*    (2023.01)

(56) References Cited

FOREIGN PATENT DOCUMENTS

| | | |
|---|---|---|
| CN | 110233167 A | 9/2019 |
| CN | 210134053 U | 3/2020 |
| CN | 211238260 U | 8/2020 |
| JP | 2013-232040 A | 11/2013 |

\* cited by examiner

DISPLAY DEVICE

CROSS REFERENCE TO RELATED APPLICATIONS

The disclosure is a national phase entry under 35 U.S.C. § 371 of International Application No. PCT/CN2021/0744950, filed on Feb. 2, 2021, which claims priority to Chinese Patent Application No. 202010220653.6, filed to the China National intellectual Property Administration on Mar. 25, 2020 and entitled "DISPLAY DEVICE", the entire contents of which are incorporated herein by reference.

FIELD

The disclosure relates to the technical field of display, in particular to a display device.

BACKGROUND

In the related art, a display panel of a bezel-less screen design is increasingly popular with consumers. A bezel-less screen refers to a panel structure using an ultra-narrow bezel design and with a notch in a display region for accommodating a camera and other devices. The bezel-less screen has the highest screen-to-body ratio among the panel display screens.

SUMMARY

Embodiments of the disclosure provides a display device, including:
  a first camera region, configured to install a first camera therein;
  a second camera region, arranged in parallel with the first camera region along a first direction and configured to install a second camera therein;
  a function integrating region, located between the first camera region and the second camera region and configured to install a plurality of functional modules therein;
  an ambient light sensing region, arranged in parallel with the function integrating region along a second direction and configured to install an ambient light sensor therein, wherein the second direction intersects with the first direction;
  a display panel, including a first through hole located in the first camera region, a second through hole located in the second camera region, and a non-display region between the first through hole and the second through hole;
  a cover plate, disposed on a display side of the display panel;
  a grid glue, disposed on a side of the display panel facing away from the cover plate, wherein the grid glue has a first opening in each of the first camera region, the second camera region, the function integrating region and the ambient light sensing region, and in each of the first camera region and the second camera region, an orthographic projection of the first opening on a plane where the cover plate is located fully covers and has an area greater than an orthographic projection of the first through hole and the second through hole on a plane where the cover plate is located;
  a rigid heat dissipating layer, disposed on a side of the grid glue facing away from the display panel, wherein the rigid heat dissipating layer has a second opening in each of the first camera region, the second camera region, the function integrating region and the ambient light sensing region, and in each of the first camera region, the second camera region, the function integrating region and the ambient light sensing region, an orthographic projection of the second opening on the plane where the cover plate is located fully covers and has an area greater than the orthographic projection of the first opening; and
  a photosensitive module, disposed on a side of the rigid heat dissipating layer facing away from the grid glue, wherein an orthographic projection of the photosensitive module on the plane where the cover plate is located covers and has an area greater than the orthographic projections of the first openings and the second openings.

Optionally, in the display device provided by embodiments of the disclosure, the first opening and the second opening in each of the first camera region and the second camera region is circular.

Optionally, in the display device provided by embodiments of the disclosure, a distance between a boundary of an orthographic projection of the first opening in a circle on the plane where the cover plate is located and a boundary of an orthographic projection of the second opening in a circle is 0.15 μm-3 μm.

Optionally, in the display device provided by embodiments of the disclosure, the first opening in the function integrating region is in a shape of a Chinese character '凸', and the second opening in the function integrating region is rectangular.

Optionally, in the display device provided by embodiments of the disclosure, two boundaries of an orthographic projection of the second opening in a rectangle in the second direction, on the plane where the cover plate is located align with two boundaries of an orthographic projection of the first opening in the shape of Chinese character '凸' close to the ambient light sensing region and in the second direction, and a distance between the two boundaries of the orthographic projection of the rectangle and two boundaries of the orthographic projection of the first opening in the shape of Chinese character '凸' in the second direction and away from the ambient light sensing region, is 0.15 μm-3 μm;
  a distance between an orthographic projection of an edge, away from a side of the ambient light sensing region in the first direction, of the second opening in the rectangle on the plane where the cover plate is located and an orthographic projection of an edge of the first opening in the shape of Chinese character '凸' on the plane where the cover plate is located, away from the side of the ambient light sensing region in the first direction, is 0.15 μm-3 μm; and
  an orthographic projection of an edge of the second opening in the rectangle close to the side of the ambient light sensing region in the first direction on the plane where the cover plate is located, aligns with an orthographic projection of an edge of the first opening in the shape of Chinese character '凸' close to the side of the ambient light sensing region in the first direction on the plane where the cover plate is located.

Optionally, in the display device provided by embodiments of the disclosure, the first opening and the second opening in the ambient light sensing region are rectangular.

Optionally, in the display device provided by embodiments of the disclosure, a distance between a boundary of an orthographic projection of the first opening in an rectangle on the plane where the cover plate is located and a boundary of an orthographic projection of the second opening in an rectangle on the plane where the cover plate is located is 0.15-3 μm.

Optionally, the display device provided by embodiments of the disclosure further includes: a foam located between the grid glue and the rigid heat dissipating layer, the foam has a third opening in each of the first camera region, the second camera region, the function integrating region and the ambient light sensing region; and an orthographic projection of the third opening on the plane where the cover plate is located fully overlaps with the orthographic projection of the first opening on the plane where the cover plate is located.

Optionally, the display device provided by embodiments of the disclosure further includes: a flexible heat dissipating layer located between the foam and the rigid heat dissipating layer;

the flexible heat dissipating layer has a fourth opening in each of the first camera region, the second camera region, the function integrating region and the ambient light sensing region; and an orthographic projection of the fourth opening on the plane where the cover plate is located fully overlaps with the orthographic projection of the second opening on the plane where the cover plate is located.

Optionally, in the display device provided by embodiments of the disclosure, the photosensitive module covers the second opening and is in direct contact with a side of the rigid heat dissipating layer facing away from the grid glue.

Optionally, in the display device provided by embodiments of the disclosure, the photosensitive module is further arranged in the second opening and in a space between the second opening and the first opening.

the space is larger than the first opening and smaller than or equal to the second opening.

Optionally, in the display device provided by embodiments of the disclosure; the display panel to which the function integrating region corresponds includes: a first gate insulating layer, a second gate insulating layer, an interlayer dielectric layer, a planarization layer, a light emitting layer, a cathode and an encapsulation layer which are arranged in stack.

Optionally, in the display device provided by embodiments of the disclosure, the display panel to which the function integrating region corresponds includes: a driving backplane, an anode, a light-emitting functional layer, a cathode, and an encapsulation layer which are arranged in stack.

Optionally, in the display device provided by embodiments of the disclosure, the display panel further includes: a first signal line extending in the first direction, and a second signal line extending in the second direction;

on the plane where the cover plate is located, an orthographic projection of the first signal line to which the first camera region, the second camera region, the function integrating region and the ambient light sensing region correspond encircles a boundary of an orthographic projection of the second opening in the first camera region, the second camera region, the function integrating region and the ambient light sensing region in the first direction; and on the plane where the cover plate is located, an orthographic projection of the second signal line to which the first camera region, the second camera region, the function integrating region and the ambient light sensing region correspond encircles a boundary of the orthographic projection of the second opening in the second direction in the first camera region, the second camera region, the function integrating region and the ambient light sensing region.

Optionally, the display device provided by embodiments of the disclosure further includes: a shading part located between the display panel and the cover plate; and the shading part has a fifth opening in each of the first camera region, the second camera region, the function integrating region and the ambient light sensing region, and an orthographic projection of the fifth openings in the first camera region and the second camera region on the plane where the cover plate is located is located within the orthographic projection of the first through hole and the second through hole.

DETAILED DESCRIPTION

Figure 1:
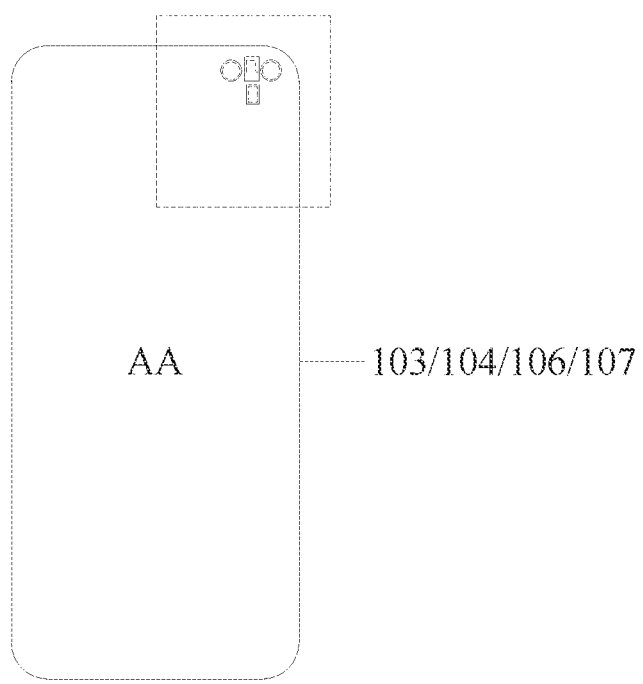
FIG. 1 is a schematic structural top view of a side with a photosensitive module of a display device provided by embodiments of the disclosure.

In order to make objectives, technical solutions and advantages of embodiments of the disclosure clearer, the technical solutions of the embodiments of the disclosure will be clearly and completely described below in combination with the accompanying drawings of the embodiments of the disclosure. Apparently, the described embodiments are only some embodiments of the disclosure, rather than all the embodiments. Based on the described embodiments of the disclosure, all other embodiments obtained by those of ordinary skill in the art without creative efforts fall within the protection scope of the disclosure.

Unless otherwise defined, technical or scientific terms used herein shall have the ordinary meaning as understood by those of ordinary skill in the art to which the disclosure belongs. Similar words such as "first" or "second" used in the specification and the claims of the disclosure do not denote any order, quantity, or importance, but are merely used to distinguish the various components. Similar words such as "comprise" or "include" mean that elements or items appearing before the words encompass elements or items listed after the words and their equivalents, but do not exclude other elements or items. "Inner", "outer", "upper", "lower", etc. are only used to indicate a relative positional relationship, and when an absolute position of a described object changes, the relative positional relationship may also change accordingly.

It should be noted that dimensions and shapes of figures in the accompanying drawings do not reflect a real scale, and are only intended to illustrate contents of the disclosure. The same or similar reference numerals refer to the same or similar elements or elements having the same or similar functions throughout.

With the development of science and technology, consumers have higher and higher requirements for performance of a display panel. Greatly improving the performance will inevitably increase power consumption of the display panel. The most direct response to the increase in power consumption is that the display panel generates more heat. In order to avoid influence of excessive heat concentration on the consumers' experience of using the display panel, a heat dissipation film including at least two film layers is provided on a hack of the display panel in the related art. In addition, for the display panel designed specific to a bezel-less screen, an integrated punching scheme is adopted to form an opening in the heat dissipation film at a camera position. However, light from a surrounding display region (AA) of the opening formed by the integrated punching scheme is prone to entering the camera and causing interference to performance of the camera.

Aiming at least for the above problem in the related art, embodiments of the disclosure provides a display device. As shown in FIG. 1 to FIG. 5, the display device includes:
- a first camera region a, configured to install a first camera therein;
- a second camera region b, arranged in parallel with the first camera region a along a first direction X and configured to install a second camera therein;
- a function integrating region c, located between the first camera region a and the second camera region b and configured to install a plurality of functional modules therein;
- an ambient light sensing region d, arranged in parallel with the function integrating region c along a second direction Y and configured to install an ambient light sensor therein, wherein the second direction Y intersects with the first direction X:
- a display panel 101, including a first through hole H01 located in the first camera region a, a second through hole H02 located in the second camera region b, and a non-display region between the first through hole H01 and the second through hole H02; wherein it needs to be noted that the non-display region between the first through hole H01 and the second through hole H02 includes the function integrating region c and the ambient light sensing region d;
- a cover plate 102, disposed on a display side of the display panel 101;
- a grid glue 103 (EMBO), disposed on a side of the display panel 101 facing away from the cover plate 102, wherein the grid glue 103 has first openings H11, H12, H13 and H14 in the first camera region a, the second camera region b, the function integrating region c and the ambient light sensing region d, and an orthographic projection of the first openings H11 and H12 in the first camera region a and the second camera region b on a plane where the cover plate 102 is located fully covers and is larger than an orthographic projection of the through holes H01 and H02, i.e. the orthographic projection of the first through hole H01 is within the orthographic projection of the first opening H11 and the orthographic projection of the second through hole H02 is within the orthographic projection of the first opening H12;
- a rigid heat dissipating layer 104, disposed on a side of the grid glue 103 facing away from the display panel 101, wherein the rigid heat dissipating layer 104 has second openings H21, H22, H23 and H24 in the first camera region a, the second camera region b, the function integrating region c and the ambient light sensing region d, and an orthographic projection of the second openings H21, H22, H23 and H24 on the plane where the cover plate 102 is located fully covers and is larger than the orthographic projection of the first openings H11, H12, H13 and H14, i.e. the orthographic projection of the first opening H11 is within the orthographic projection of the second opening H21, the orthographic projection of the first opening H12 within in the orthographic projection of the second opening H22, the orthographic projection of the first opening H13 is within the orthographic projection of the second opening H23, and the orthographic projection of the first opening H14 is within the orthographic projection of the second opening H24; and
- a photosensitive module 105, disposed on a side of the rigid heat dissipating layer 104 facing away from the grid glue 103, wherein an orthographic projection of the photosensitive module 105 on the plane where the cover plate 102 is located fully covers and is larger than the orthographic projections of the first openings H11, H12, H13 and H14 as well as the second openings H21, H22, H23 and H24.

It should be understood that orthographic projection relationships among the first openings H11, H12, H13 and H14, the second openings H21, H22, H23 and H24, and the photosensitive module 105 refer to orthographic projection relationships among the three in a same region (the first camera region a, the second camera region b, the function integrating region c or the ambient light sensing region d). Shapes and sizes of the first openings H11, H12, H13 and H14 may be the same or different. Shapes and sizes of the second openings H21, H22, H23 and H24 may be the same or different. In addition, a schematic structural diagram of the display device shown in FIG. 1 is a schematic structural diagram viewed from a side of the photosensitive module 105.

In the above display device provided by embodiments of the disclosure, the orthographic projection of the second openings H21, H22, H23 and H24 of the rigid heat dissipating layer 104 on the plane where the cover plate 102 is located fully covers and is larger than the orthographic projection of the first openings H11, H12, H13 and H14 of the grid glue 103, i.e. in the same region, the grid glue 103 is more inwardly expanded compared with the rigid heat dissipating layer 104. Because the grid glue 103 (EMBO)

itself has a shading property, the inwardly expanded grid glue 103 may effectively shield light in a region AA around a through hole H0 of the display panel 101, thereby reducing influence of light leakage of the display panel 101 on performance of the photosensitive module 105.

It needs to be noted that the above display device provided by embodiments of the disclosure may be: a mobile phone, a tablet computer, a TV, a display, a laptop, a digital photo frame, a navigator, a smart watch, a fitness wristband, a personal digital assistant and any other product or component with a display function. Other essential components of the display device should be understood by those of ordinary skill in the art, and will not be repeated here, nor should it be used as a limitation on the disclosure.

Optionally, in the above display device provided by embodiments of the disclosure, the display panel 101 may be an organic light emitting diode (OLED) display panel, or may be a liquid crystal display (LCD) panel. The OLED display panel has the characteristics of low power consumption, fast response, large viewing angle, bright colors, and usage as a flexible screen. Preferably, the display panel 101 in the disclosure is the OLED display panel. When the display panel 101 is the OLED display panel, it may generally include a base substrate, a buffer layer, a gate electrode, a first gate insulating layer, a second gate insulating layer, an active layer, an interlayer dielectric layer, a source and drain layer, a planarization layer, a pixel-defining layer, an anode, a light-emitting functional layer, a cathode, and a thin-film encapsulation layer. Among them, the base substrate, the buffer layer, the gate electrode, the first gate insulating layer, the second gate insulating layer, the active layer, the interlayer dielectric layer, and the source and drain layer are used to form a driving circuit (e.g., a gate driving circuit GOA and a source driving circuit); the light-emitting functional layer includes a hole injection layer, a hole transport layer, a light-emitting material layer, an electron transport layer, an electron injection layer and a cathode. In addition, other essential components of the display panel 101 should be understood by those of ordinary skill in the art, and will not be repeated here, nor should it be regarded as a limitation on the disclosure.

Optionally, in the above display device provided by embodiments of the disclosure, the display panel 101 around the first camera region a, the second camera region h, the function integrating region c, and the ambient light sensing region d achieves normal display, and under a condition that the display panel 101 is the OLED display panel, the display panel 101 has the film layer structure mentioned above. In some embodiments, a structure of the display panel 101 to which the function integrating region c corresponds may be the same as a structure of the display panel 101 around the function integrating region c. In some other embodiments, to increase a light transmission rate at the function integrating region c, the structure of the display panel 101 to which the function integrating region c corresponds may be different from the structure of the display panel 101 around the function integrating region c. In this case; the display panel 101 to which the function integrating region c corresponds includes: the first gate insulating layer, the second gate insulating layer, the interlayer dielectric layer, the planarization layer, the light emitting layer and the cathode encapsulation layer which are arranged in stack. In addition, a structure of the display panel 101 to which the ambient light sensing region d corresponds is the same as a structure of the display panel 101 around the ambient light sensing region d.

Optionally, in the above display device provided by embodiments of the disclosure, the cover plate 102 may be a transparent glass substrate, or may be other transparent substrates (e.g., a plastic transparent substrate) known to those of skill in the art, which are not limited herein. The grid glue 103 may be a reticulated protective film or an embossed silicone gel buffer strip. A material of the rigid heat dissipating layer 104 may be a metal with relatively good heat conductivity such as copper (Cu) and silver (Ag); and because Cu is wide in sources, easy to obtain and low in cost, in some embodiments of the disclosure, Cu is selected as the material of the rigid heat dissipating layer 104. The photosensitive module 105 may be but is not limited to a normal camera, a depth (Time of Flight, TOF) camera, an ambient light sensor, an infrared (IR) sensor or other photosensitive elements. A multi-functional module at least includes a TOF camera, an IR sensor and a charging indicator. Specifically, the IR sensor may facilitate screen-off when the face touches the screen, which avoids a false touch operation during a call. The TOF camera may sense a distance, and form a 3D structure through calculation according to the sensed distance, thereby realizing 3D face recognition. The charging indicator achieves a charging indicating effect. Normally, it flashes red when a battery is low, displays red during a charging process and displays green when charging is complete. The ambient light sensor is configured to sense surrounding ambient light and automatically adjusts screen display brightness according to brightness of the ambient light.

In addition, it needs to be noted that in the above display device provided by embodiments of the disclosure, the first camera region a, the second camera region b, the function integrating region c and the ambient light sensing region d are arranged close to one another in the display region AA. For example, in FIG. 1, exemplarily, the first camera region a, the second camera region b, the function integrating region c and the ambient light sensing region d are arranged at an upper right corner of the display device. Of course, in practical design, the first camera region a, the second camera region b, the function integrating region c and the ambient light sensing region d may also be arranged at an upper left corner of the display device, or be arranged in a region between the upper left corner and the upper right corner, which may specifically be arranged according to customer's requirements and is not limited here.

Figure 2:
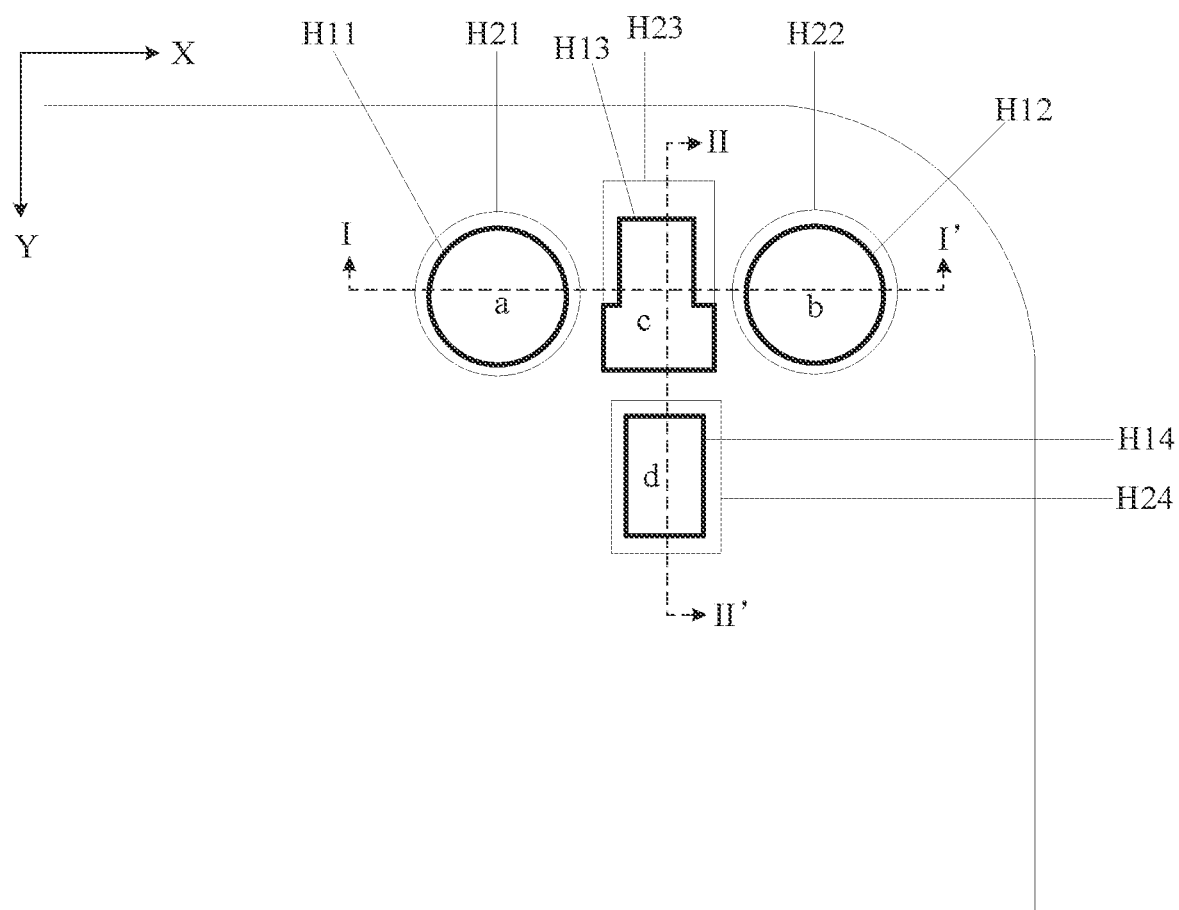
FIG. 2 is a schematic structural enlarged view of a region in a dotted box in FIG. 1.
Figure 3:
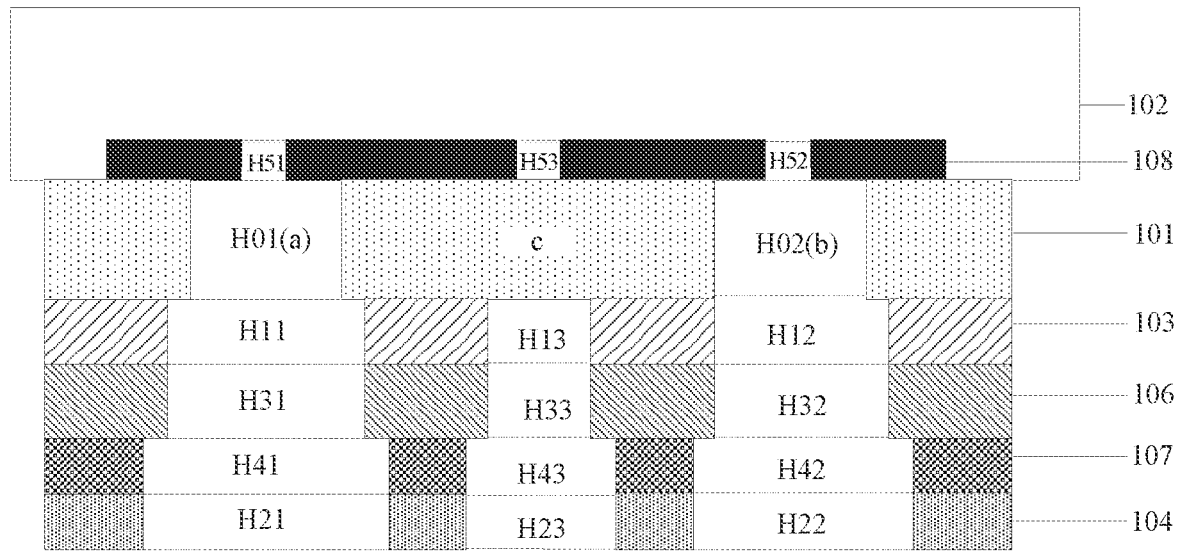
FIG. 3 is a schematic structural sectional view along a dotted line 14' in FIG. 1.

Optionally, in the above display device provided by embodiments of the disclosure, as shown in FIG. 2 and FIG. 3, each of the first openings and H12 and the second openings H21 and H22 in the first camera region a and the second camera region b is circular.

A distance between a boundary of the orthographic projection of the first openings H11 and H12 and a boundary of the orthographic projection of the second openings H21 and H22 on the plane where the cover plate 102 is located is 0.15 μm-3 μm, e.g. 0.15 μm, 0.17 μm, 0.2 μm, 0.23 μm, 0.25 μm, 0.3 μm, 0.32 μm, 0.35 μm, 0.4 μm, 0.5 μm, 0.6 μm, 0.7 μm, 0.8 μm, 0.9 μm, 1.0 μm, 1.5 μm, 2.0 μm, 2.5 μm 3.0 μm, etc.

Figure 4:
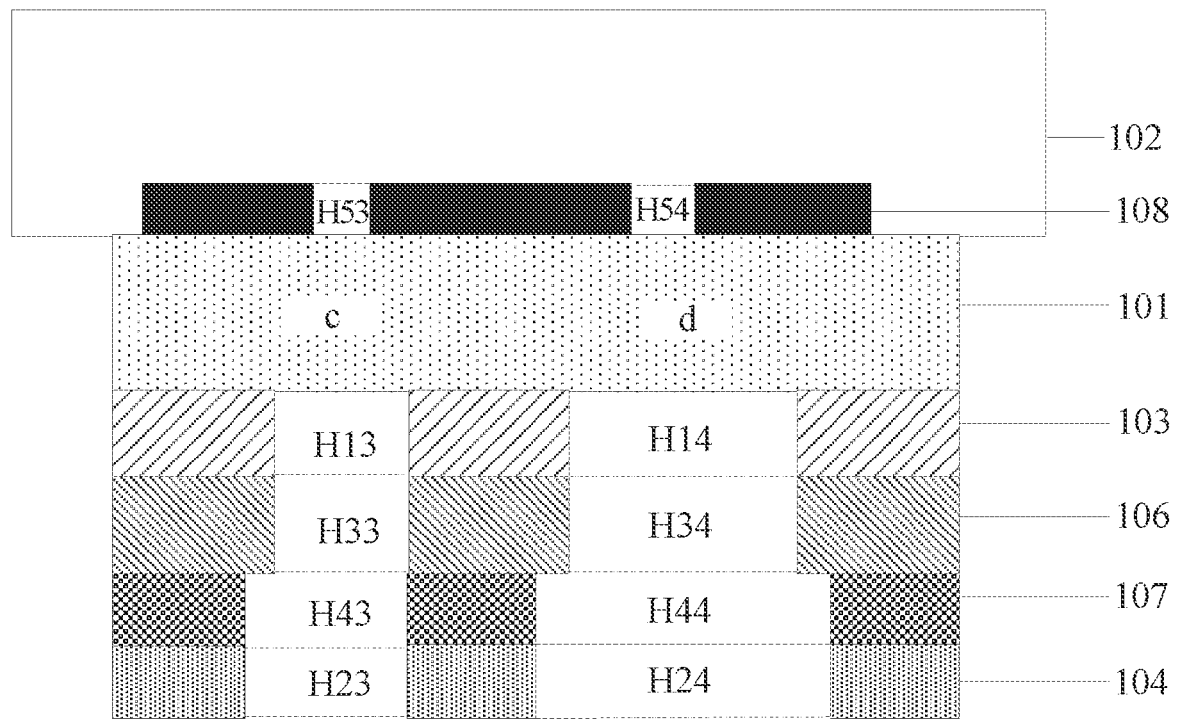
FIG. 4 is a schematic structural sectional view along a dotted line IMF in FIG. 1.

Optionally, in the above display device provided by embodiments of the disclosure, as shown in FIG. 2 to FIG. 4, in the function integrating region c, a shape of the corresponding first opening H13 is approximately a Chinese character '凸', and the corresponding second opening H23 is rectangular.

Two boundaries (i.e. left and right edges in the second opening in the rectangle H23 in FIG. 2), in the second direction Y of an orthographic projection of a rectangle of the second opening H23 on the plane where the cover plate 102 is located align with two boundaries (i.e., left and right edges of a lower part of the first opening H13 in the shape of the Chinese character '凸' FIG. 2), in the second direction Y and close to the ambient light sensing region d, of an orthographic projection of the first opening H13 in the shape of the Chinese character '凸'. Distances between the two boundaries of the orthographic projection of the rectangle and two boundaries i.e. left and right edges of an upper part of the first opening H13 in the shape of the Chinese character '凸' in FIG. 2), in the second direction Y and away from the ambient light sensing region d, of the orthographic projection of the first opening H13 in the shape of the Chinese character '凸' are 0.15 μm-3 μm, e.g. 0.15 μm, 0.17 μm, 0.2 μm, 0.23 μm, 0.25 μm, 0.3 μm, 0.32 μm, 0.35 μm, 0.4 μm, 0.5 μm, 0.6 μm, 0.7 μm, 0.8 μm, 0.9 μm, 1.0 μM, 1.5 μm, 2.0 μm, 2.5 μm, 3.0 μm, etc.

A distance between an orthographic projection of an edge (i.e. an upper edge of the second opening in the rectangle H23 in FIG. 2), away from a side of the ambient light sensing region d in the first direction X, of the second opening in the rectangle H23 on the plane where the cover plate 102 is located and an orthographic projection of an edge (i.e. an upper edge of an upper part of the first opening H13 in the shape of the Chinese character ' a' in FIG. 2), away from the side of the ambient light sensing region d in the first direction X, of the first opening H13 in the shape of the Chinese character '凸' is 0.15 μm-3 part, e.g. 0.15 μm, 0.17 μm, 0.2 μm, 0.23 μm, 0.25 μm, 0.3 μm, 0.32 μm, 0.35 μm, 0.4 μm, 0.5 μm, 0.6 μm, 0.7 μm, 0.8 μm, 0.9 μm, 1.0 μm, 1.5 μm, 2.0 μm, 2.5 μm, 3.0 μm, etc.

An orthographic projection of an edge (i.e. a lower edge of the second opening in the rectangle H23 in FIG. 2), close to a side of the ambient light sensing region d in the first direction X, of the second opening in the rectangle H23 on the plane where the cover plate 102 is located aligns or approximately aligns with an orthographic projection of an edge (i.e. a lower edge of a lower part of the first opening H13 in the shape of the Chinese character in FIG. 2), close to the side of the ambient light sensing region d in the first direction X, of the first opening H13 in the shape of the Chinese character '凸'.

It is worth noting that, limited by product space and customer requirements, a shape of the first opening H13 is set as the shape of the Chinese character '凸'. In specific implementation, the shape of the first opening H13 may also be a rectangle, that is, the shapes of the first opening H13 and the second opening H23 are both rectangles, which is not limited herein.

Optionally, in the above display device provided by embodiments of the disclosure, as shown in FIG. 2 and FIG. 4, in the ambient light sensing region d, the first opening H14 and the second opening H24 are both rectangular.

A distance between a boundary of an orthographic projection of an rectangle of the first opening H14 on the plane where the cover plate 102 is located and a boundary of an orthographic projection of an rectangle of the second opening H24 is 0.15 μm-3 μm, e.g. 0.15 μm, 0.17 μm, 0.2 μm, 0.23 μm, 0.25 μm, 0.3 μm, 0.32 μm, 0.35 μm, 0.4 μm, 0.5 μm, 0.6 μm, 0.7 μm, 0.8 μm, 0.9 μm, 1.0 μm, 1.5 μm, 2.0 μm, 2.5 μm, 3.0 μm, etc.

It needs to be noted that in the above display device provided by embodiments of the disclosure, the shapes of the first openings H11, H12, H13 and H14 and the second openings H21, H22, H23 and H24 are only exemplarily described above. In specific implementation, the shapes of the first openings H11, H12, H13 and H14 and the second openings H21, H22, H23 and H24 may be diversified, for example, may be circle, ellipse, rectangle, regular polygon, triangle, rhombus, trapezoid, pentagon or any other regular or irregular shapes, which is not limited here. Shapes of the first through hole H01 and the second through hole H02 may be the same as or different from the shapes of the first openings H11, H12, H13 and H14 and the second openings H21, H22, H23 and H24, which is not limited here. Preferably, to simplify a manufacturing process, the through holes H0, the first openings H1 and the second openings H2 are the same in shape. For example, the shapes of the three are circular as shown in FIG. 2, and for another example, the shapes of the three are rectangular as shown in FIG. 2.

Optionally, in the above display device provided by embodiments of the disclosure, as shown in FIG. 3 and FIG. 4, the display device further includes: foam 106 located between the grid glue 103 and the rigid heat dissipating layer 104, and a flexible heat dissipating layer 107 located between the foam 106 and the rigid heat dissipating layer 104. The foam 106 to which the first camera region a, the second camera region b, the function integrating region c and the ambient light sensing region d correspond has third openings H31, H32, H33 and H34, and the flexible heat dissipating layer 107 to which the first camera region a, the second camera region b, the function integrating region c and the ambient light sensing region d correspond has fourth openings H41, H42, H43 and H44.

In any one region among the first camera region a, the second camera region h, the function integrating region c and the ambient light sensing region d, orthographic projection relationships of the openings are the same among the photosensitive module 105, the grid glue 103, the rigid heat dissipating layer 104, the foam 106 and the flexible heat dissipating layer 107. Therefore, for the convenience of the technical solution of the disclosure, the following description is merely made by taking the orthographic projection relationships of the openings among the photosensitive module 105, the grid glue 103, the rigid heat dissipating layer 104, the foam 106 and the flexible heat dissipating layer 107 to which the first camera region a corresponds as an example. In the second camera region h, the function integrating region c and the ambient light sensing region d, the orthographic projection relationships of the openings among the photosensitive module 105, the grid glue 103, the rigid heat dissipating layer 104, the foam 106 and the flexible heat dissipating layer 107 may refer to the following contents, which is not repeated in the disclosure.

Optionally, in the above display device provided by embodiments of the disclosure, as shown in FIG. 5 to FIG. 10, the display device further includes: the foam 106 located between the grid glue 103 and the rigid heat dissipating layer 104. The foam 106 has the third opening H31 in the first camera region a.

An orthographic projection of the third opening H31 on the plane where the cover plate 102 is located covers the orthographic projection of the first opening H11, and is covered by the orthographic projection of the second opening H21. Specifically, an arrangement of the third opening H31 includes three possible implementations as follows.

Figure 5:
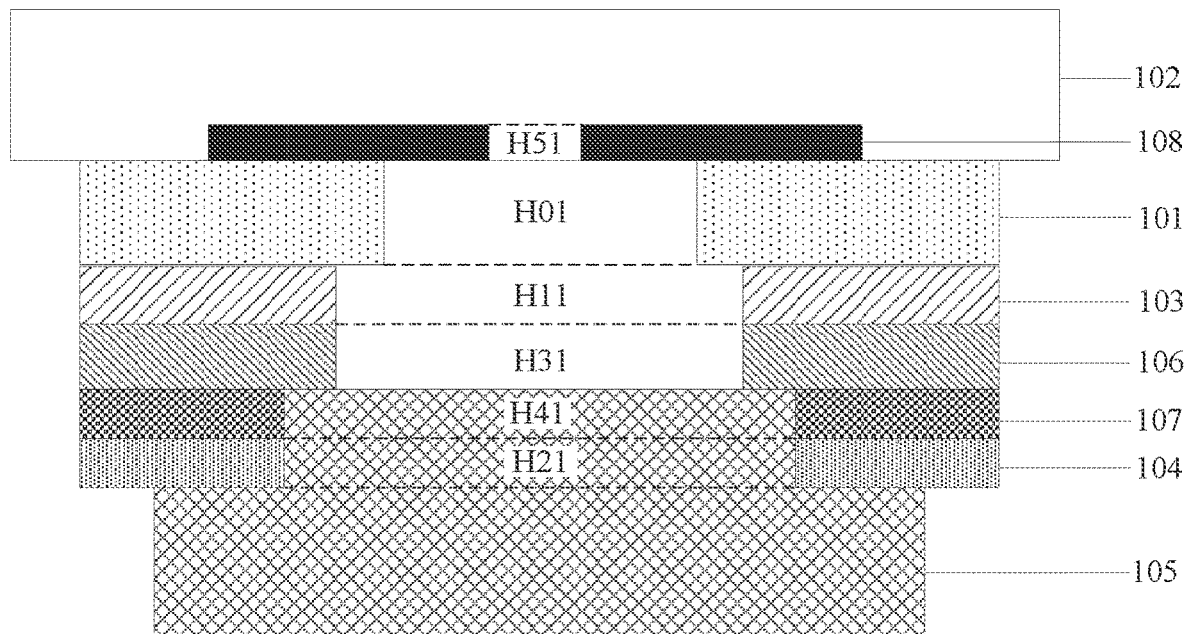
FIG. 5 is a schematic structural sectional view of a display device provided by embodiments of the disclosure.
Figure 6:
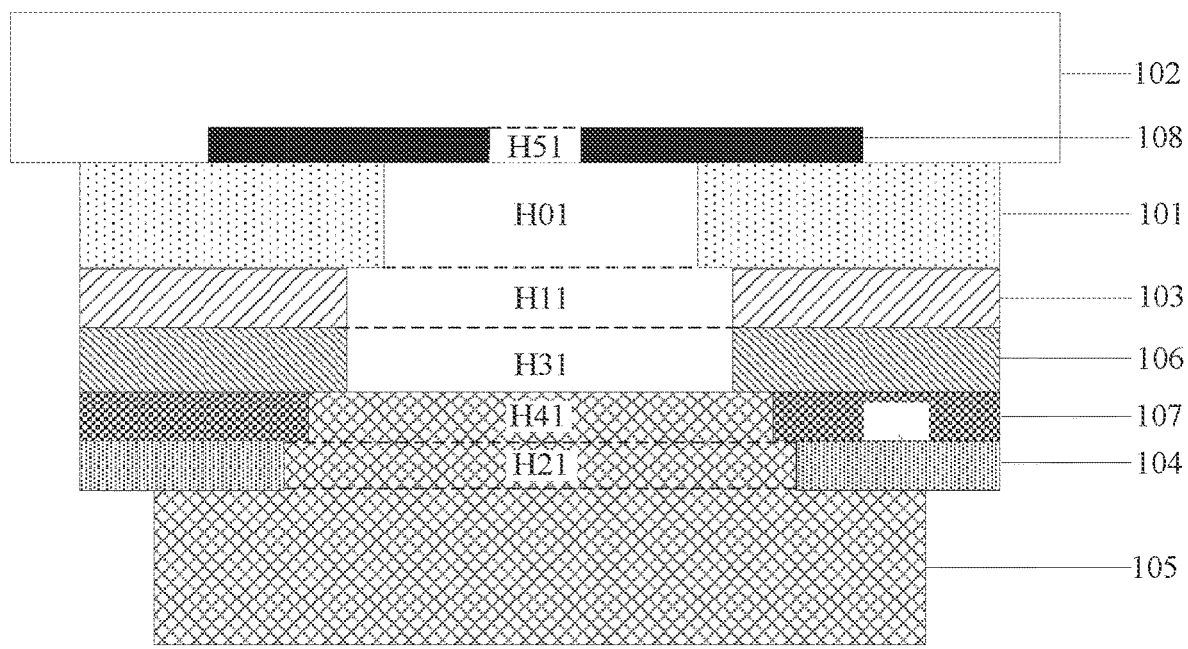
FIG. 6 is another schematic structural sectional view of a display device provided by embodiments of the disclosure.
Figure 8:
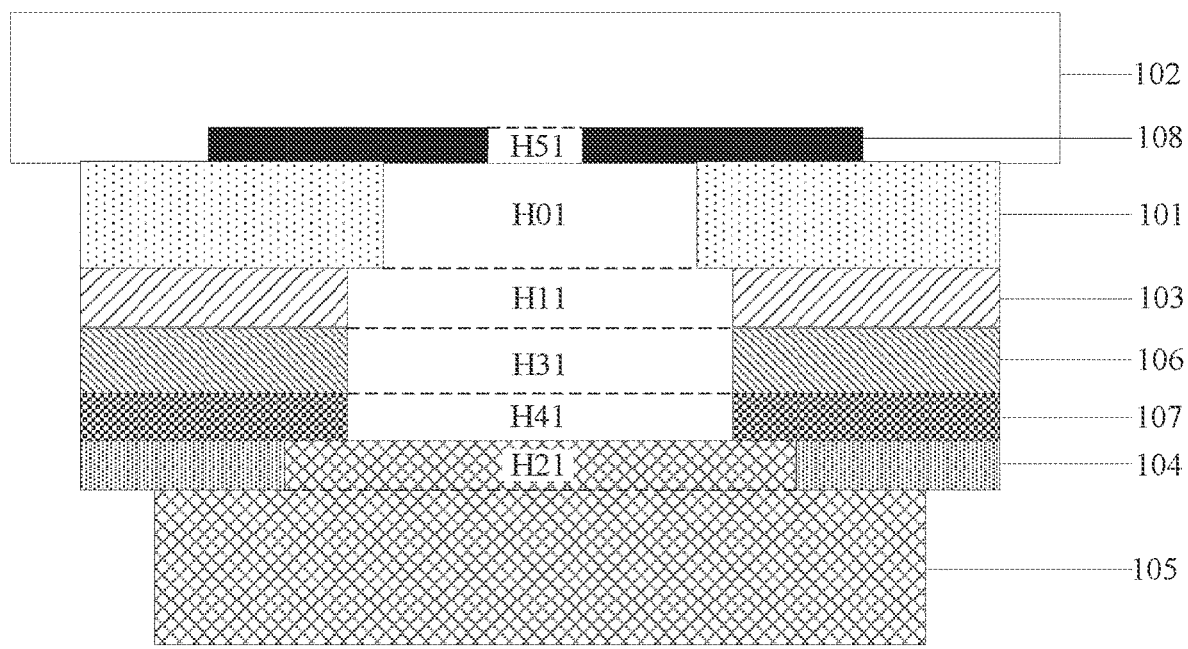
FIG. 8 is another schematic structural sectional view of a display device provided by embodiments of the disclosure.

In a first possible implementation, as shown in FIG. 5, FIG. 6 and FIG. 8, the orthographic projection of the third opening H31 is located fully overlaps with the orthographic projection of the first opening H11 on the plane where the cover plate 102. The arrangement means that the foam 106 is more inwardly expanded relative to the rigid heat dissipating layer 104. Because the foam 106 is black and has a shading function, the foam 106 with the third opening H31 may shield the light in the region AA around the first through hole H01 of the display panel 101, thereby further reducing the influence of light leakage of the display panel 101 on performance of the photosensitive module 105. Further, in the related art, integral punching is prone to causing stress around the first through hole H01 of a flexible screen and generating uneven stamping, thereby resulting in defects in an appearance of a product. The flexible foam 106 may reduce the stress around the first through hole H01 and improve a phenomenon of poor stamping around the first through hole H01. In addition, the third opening H31 and the first opening H11 which fully overlap with each other may further be formed at the same time through a one-time punching process, so the manufacturing process is simplified and a production efficiency is improved.

Figure 10:
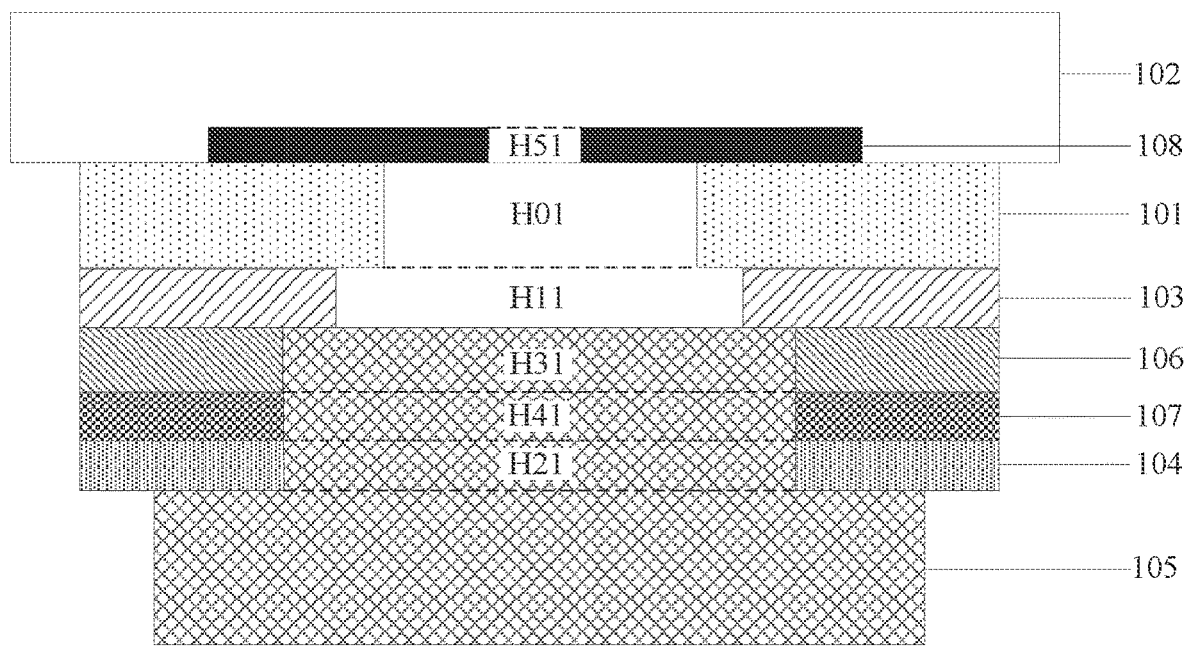
FIG. 10 is another schematic structural sectional view of a display device provided by embodiments of the disclosure.
Figure 11:
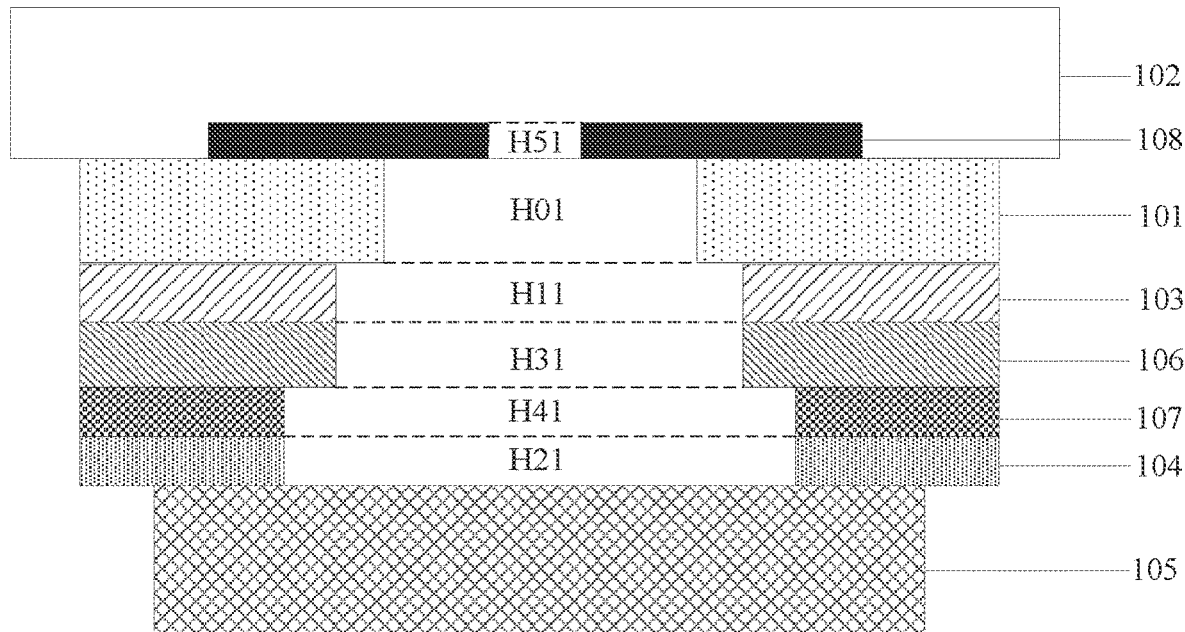
FIG. 11 is another schematic structural sectional view of a display device provided by embodiments of the disclosure.
Figure 12:
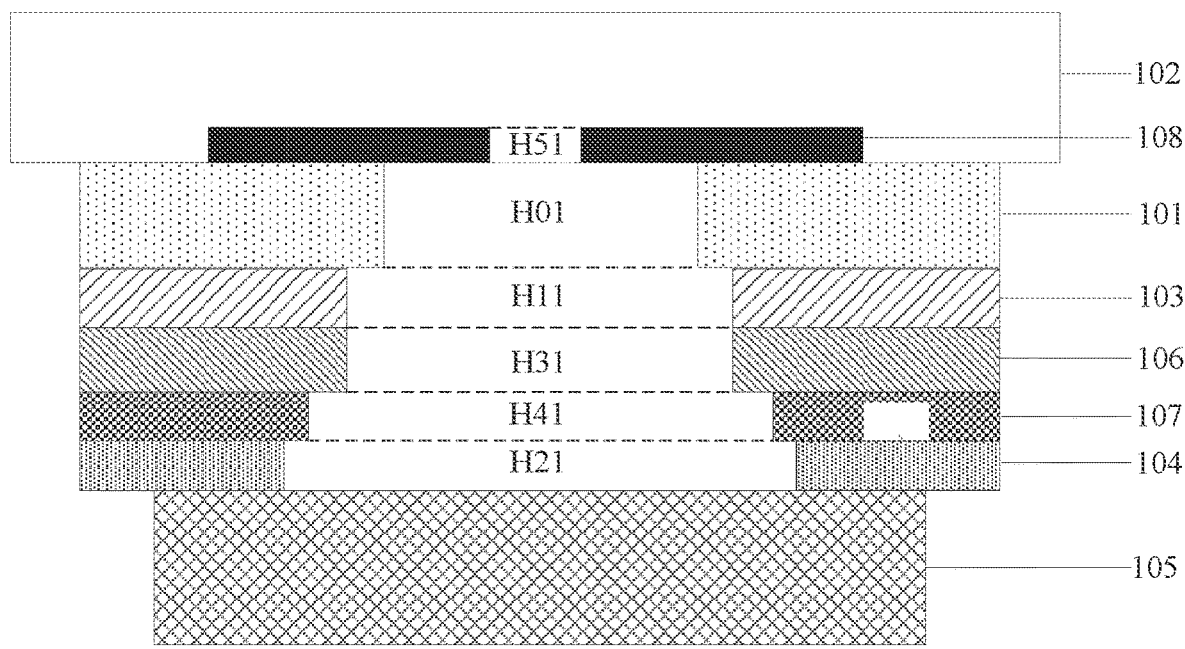
FIG. 12 is another schematic structural sectional view of a display device provided by embodiments of the disclosure.
Figure 13:
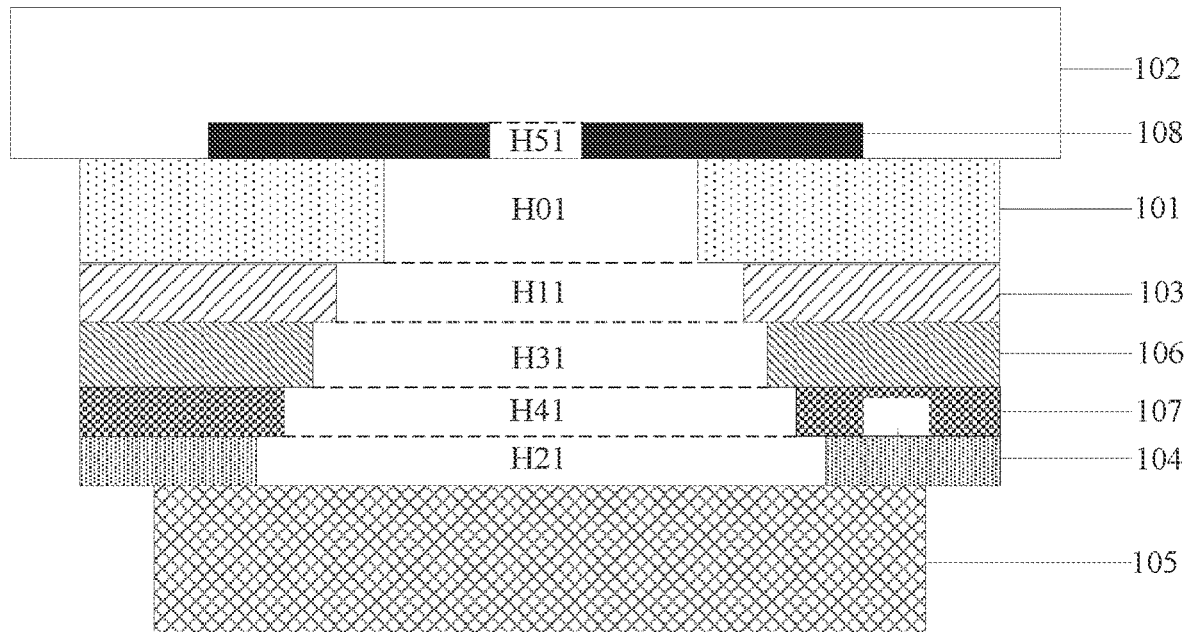
FIG. 13 is another schematic structural sectional view of a display device provided by embodiments of the disclosure.
Figure 14:
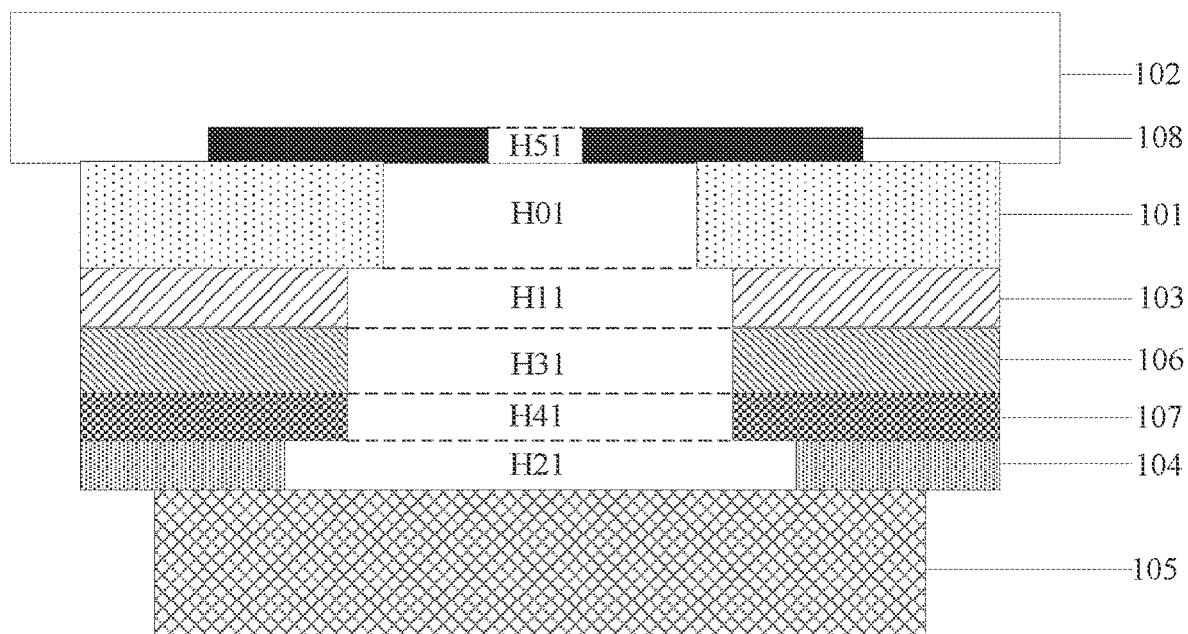
FIG. 14 is another schematic structural sectional view of a display device provided by embodiments of the disclosure.
Figure 15:
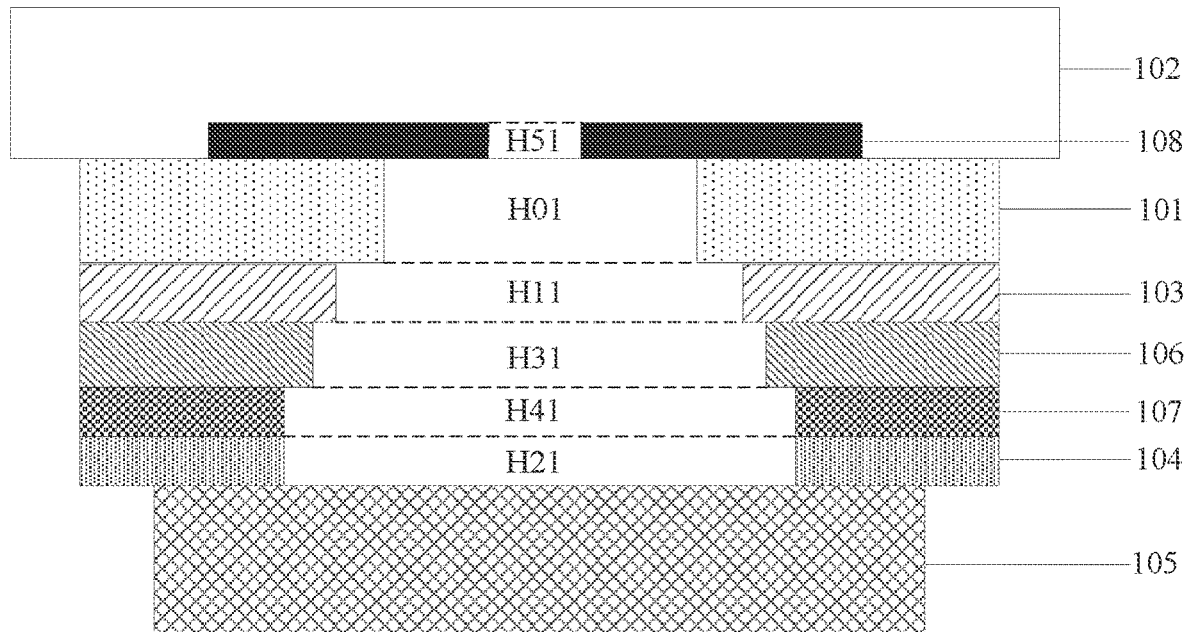
FIG. 15 is another schematic structural sectional view of a display device provided by embodiments of the disclosure.
Figure 16:
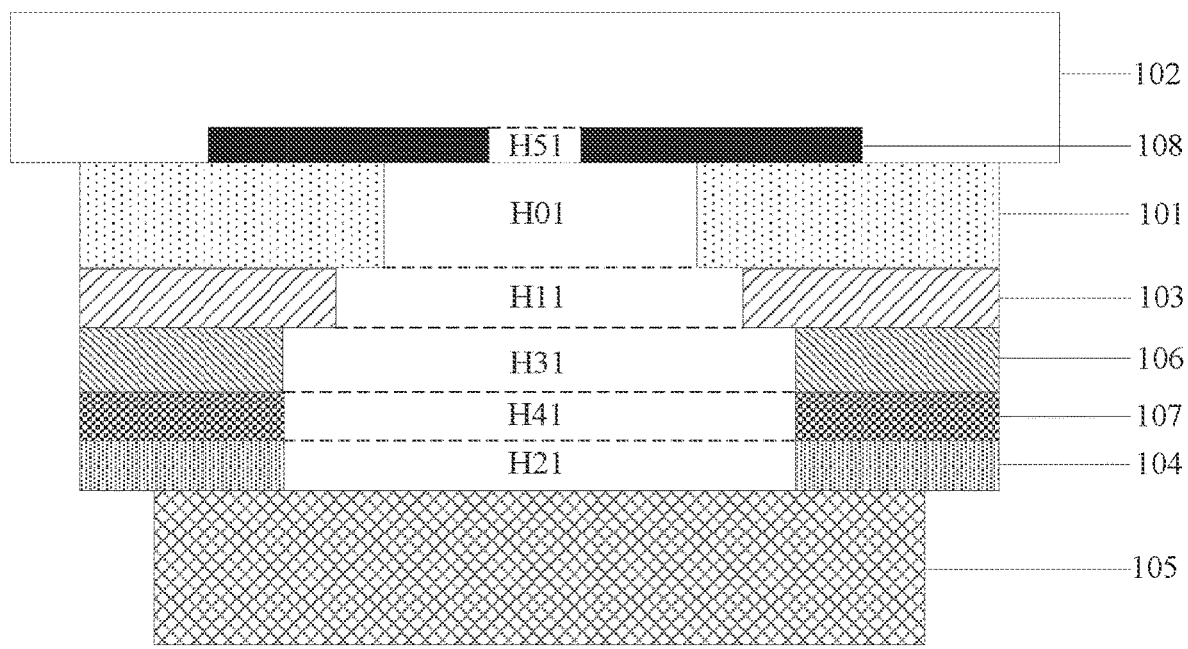
FIG. 16 is another schematic structural sectional view of a display device provided by embodiments of the disclosure.

In a second possible implementation, as shown in FIG. 10, the orthographic projection of the third opening H31 on the plane where the cover plate 102 is located fully overlaps with the orthographic projection of the second opening H21. Through the arrangement, the photosensitive module 105 may be assembled into the display device in a simpler, more convenient and faster manner through a bonding effect of the grid glue 103 itself, so production time is greatly shortened and the production efficiency is improved. In addition, the third opening H31 and the second opening H21 may further be formed at the same time through the one-time punching process, so the manufacturing process is simplified and the production efficiency is further improved.

Figure 7:
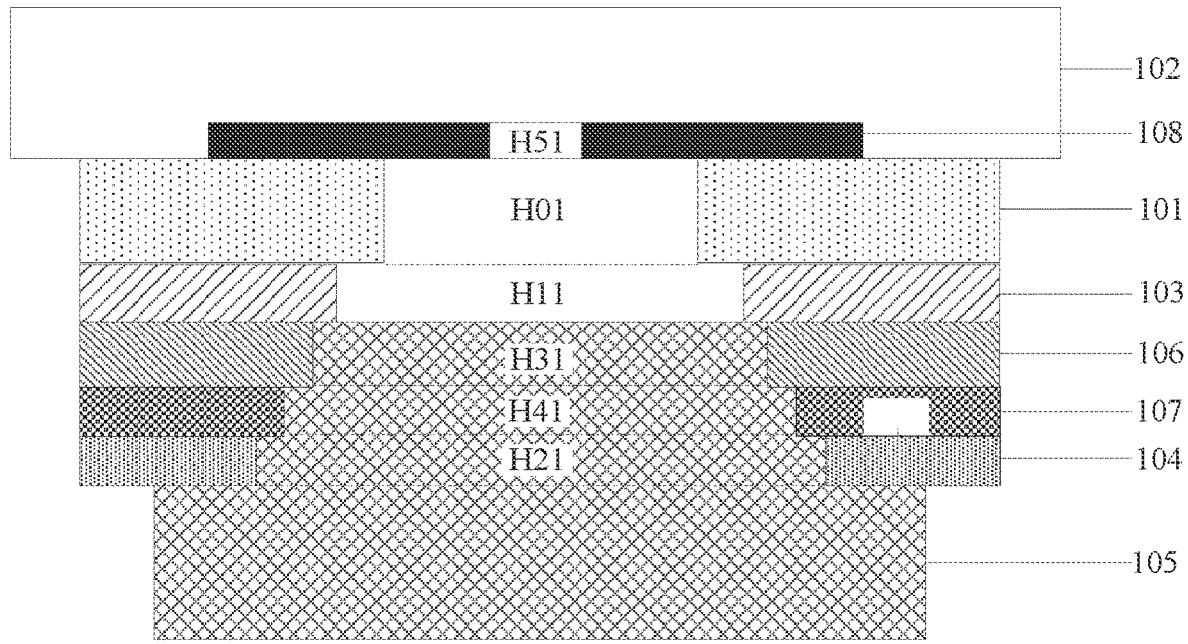
FIG. 7 is another schematic structural sectional view of a display device provided by embodiments of the disclosure.
Figure 9:
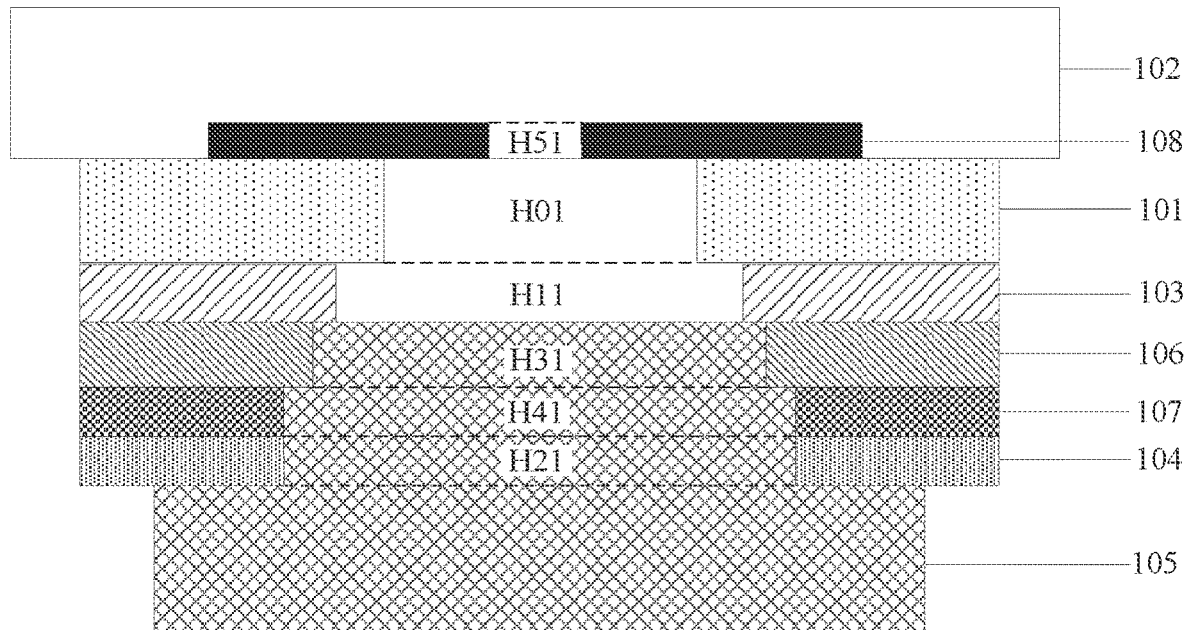
FIG. 9 is another schematic structural sectional view of a display device provided by embodiments of the disclosure.

In a third possible implementation, as shown in FIG. 7 and FIG. 9, the orthographic projection of the third opening H31 is located is larger than the orthographic projection of the first opening H11 and smaller than the orthographic projection of the second opening H21 on the plane where the cover plate 102. That is, the foam 106 expands inwardly relative to the rigid heat dissipating layer 104 and is outwardly contracted relative to the grid glue 102. Through the arrangement, on the one hand, shielding of the light in the region AA around the first through hole H01 of the display panel 101 may be realized by utilizing the shading function of the foam 106, thereby further reducing the influence of light leakage of the display panel 101 on performance of the photosensitive module 105; on the other hand, the stress around the first through hole H01 may be reduced by utilizing a buffering effect of the foam 106, thereby improving the phenomenon of poor stamping around the first through hole H01; further on the other hand, the photosensitive module 105 may be assembled into the display device in a simpler, more convenient and faster manner through the bonding effect of the grid glue 103 itself, so production time is greatly shortened and the production efficiency is improved.

It needs to be noted that, in the above display device provided by embodiments of the disclosure, the shapes of the third opening H31, the first opening H1_1 and the second opening H21 may be the same or different, which is not limited here. It may be understood that under a condition that any two of the third opening H31, the first opening H11 and the second opening H21 fully overlaps with each other, their shapes are inevitably the same. Further, types of the foam 106 may specifically include polyurethane (PU) foam, ultra-thin shock-absorbing foam, conductive foam, aluminum foil foam, rubber (CR) foam, and the like.

Optionally, the above display device provided by embodiments of the disclosure, as shown in FIG. 5 to FIG. 10, further includes: the flexible heat dissipating layer 107 located between the foam 106 and the rigid heat dissipating layer 104. The flexible heat dissipating layer 107 has a fourth opening H41 in the first camera region a.

An orthographic projection of the fourth opening H41 is located covers the orthographic projection of the third opening H31, and is covered by the orthographic projection of the second opening H21 on the plane Where the cover plate 102. Specifically, arrangement of the fourth opening H41 includes three possible implementations as follows.

In a first possible implementation, as shown in FIG. 5, FIG. 9 and FIG. 10, the orthographic projection of the fourth opening H41 fully overlaps with the orthographic projection of the second opening H21 on the plane where the cover plate 102 is located. Through the arrangement, the fourth opening H41 and the second opening H21 may be formed simultaneously through the one-time punching process, so the manufacturing process is simplified and the production efficiency is improved. It is worth noting that, in FIG. 10, the orthographic projection of the fourth opening H41 on the plane where the cover plate 102 is located fully overlaps with the orthographic projection of the third opening H31 on the plane where the cover plate 102 is located and the orthographic projection of the second opening H21 on the plane where the cover plate 102 is located. Therefore, in specific implementation, the fourth opening H41, the third opening H31 and the second opening H21 may be manufactured through the one-time punching process, thereby significantly improving the production efficiency.

In a second possible implementation, as shown in FIG. 8 and FIG. 10, the orthographic projection of the fourth opening H41 fully overlaps with the orthographic projection of the third opening H31 on the plane where the cover plate 102 is located. Through the arrangement, the fourth opening H41 and the third opening H31 may be formed simultaneously through the one-time punching process, so the manufacturing process is simplified and the production efficiency is improved. It is worth noting that, as shown in FIG. 8, the orthographic projection of the fourth opening H41 on the plane where the cover plate 102 is located fully overlaps with the orthographic projection of the third opening H31 on the plane where the cover plate 102 is located and the orthographic projection of the first opening H11 on the plane where the cover plate 102 is located. Therefore, in specific implementation, the fourth opening H41, the third opening H31 and the first opening H11 may be manufactured through the one-time punching process, thereby significantly improving the production efficiency. Further, as shown in FIG. 10, the orthographic projection of the fourth opening H41 on the plane where the cover plate 102 is located specifically fully overlaps with the orthographic projection of the third opening H31 on the plane where the cover plate 102 is located and the orthographic projection of the second opening H21 on the plane where the cover plate 102 is located. Therefore, in specific implementation, the fourth opening H41, the third opening H31 and the second opening H21 may be manufactured through the one-time punching process, thereby significantly improving the production efficiency.

In a third possible implementation, as shown in FIG. 6 and FIG. 7, the orthographic projection of the fourth opening H41 is larger than the orthographic projection of the third opening H31 and smaller than the orthographic projection of the second opening H21 on the plane where the cover plate 102 is located. That is, the flexible heat dissipating layer 107 expands inwardly relative to the rigid heat dissipating layer 104 and is outwardly contracted relative to the foam 106. Through the arrangement, the stress around the first through hole H01 may be reduced based on a buffering effect of the foam 106 and the flexible heat dissipating layer 107, thereby improving poor stamping around the first through hole H01.

Optionally, in the above display device provided by embodiments of the disclosure, a material of the flexible heat dissipating layer 107 may be polyimide (PI), graphite, or other materials with soft texture and good heat conductivity known to those of skill in the art, which is not limited herein.

It can be understood that, in the disclosure, "fully overlapping" refers to that two openings are the same in shape, area and size.

Optionally, in the above display device provided by embodiments of the disclosure, to better solve the problems of the influence of light leakage of the display panel 101 itself on the performance of the photosensitive module 105 and stamping around the first through hole H0, a distance between boundaries of adjacent openings which do not overlap with each other is 0.15 μm-3 μm (e.g. 0.15 μm, 0.17 μm, 0.2 μm, 0.23 μm, 0.25 μm, 0.3 μm, 0.32 μm, 0.35 μm, 0.4 μm, 0.5 μm, 0.6 μm, 0.7 μm, 0.8 μm, 0.9 μm, 1.0 μm, 1.5 μm, 2.0 μm, 2.5 μm, 3.0 μm, etc.) The adjacent openings are the first opening H11 and the third opening H31, the third opening H31 and the fourth opening H41, or the fourth opening H41 and the second opening H21.

Specifically, as shown in FIG. 5, a distance between a boundary of the third opening H31 and a boundary of the fourth opening H41 is 0.15 μm-3 μm. Because the third opening H31 fully overlaps with the first opening H11, and the fourth opening H41 fully overlaps with the second opening H21, in FIG. 5, the grid glue 102 with the first opening H11 and the foam 106 with the third opening H31 expand inwardly by 0.15 μm-3 μm relative to the flexible heat dissipating layer 107 with the fourth opening H41 and the rigid heat dissipating layer 104 with the second opening H21.

Specifically, as shown in FIG. 6, the distance between the boundary of the third opening H31 and the boundary of the fourth opening H41 is 0.15 μm-3 μm, and a distance between the boundary of the fourth opening H41 and a boundary of the second opening H21 is 0.15 μm-3 μm. Because the third opening H31 fully overlaps with the first opening H11, and the fourth opening H41 fully overlaps with the second opening H21, in FIG. 6, the flexible heat dissipating layer 107 with the fourth opening H41 expands inwardly by 0.15 μm-3 μm relative to the rigid heat dissipating layer 104 with the second opening H21; and the grid glue 102 with the first opening H11 and the foam 106 with the third opening H31 expand inwardly by 0.15 μm-3 μm relative to the flexible heat dissipating layer 107 with the fourth opening H41 and expand inwardly by 0.3 μm-6 μm relative to the rigid heat dissipating layer 104 with the second opening H21.

Specifically, as shown in FIG. 7, a distance between a boundary of the first opening H11 and the boundary of the third opening H31 is 0.15 μm-3 μm, a distance between the boundary of the third opening H31 and the boundary of the fourth opening H41 is 0.15 pan-3 μm, and a distance between the boundary of the fourth opening H41 and the boundary of the second opening H21 is 0.15 μm-3 μm. In other words, in FIG. 7, the flexible heat dissipating layer 107 with the fourth opening H41 expands inwardly by 0.15 μm-3 μm relative to the rigid heat dissipating layer 104 with the second opening H21; the foam 106 with the third opening H31 expands inwardly by 0.15 μm-3 μm relative to the flexible heat dissipating layer 107 with the fourth opening H41 and expands inwardly by 0.3 μm-6 μm relative to the rigid heat dissipating layer 104 with the second opening H21; and the grid glue 102 with the first opening expands inwardly by 0.15 μm-3 μm relative to the foam 106 with the third opening H31, expands inwardly by 0.3 μm-6 μm relative to the flexible heat dissipating layer 107 with the fourth opening H41 and expands inwardly by 0.45 μm-9 μm relative to the rigid heat dissipating layer 104 with the second opening H21.

Specifically, as shown in FIG. 8, the distance between the boundary of the fourth opening H41 and the boundary of the second opening H21 is 0.15 μm-3 μm. Because the fourth opening H41 and the third opening H31 fully overlap with the first opening H11 simultaneously, in FIG. 8, the grid glue 102 with the first opening H11, the foam 106 with the third opening H31 and the flexible heat dissipating layer 107 with the fourth opening H41 expand inwardly by 0.15 μm-3 μm relative to the rigid heat dissipating layer 104 with the second opening H21.

Specifically, as shown in FIG. 9, the distance between the boundary of the first opening H11 and the boundary of the third opening H31 is 0.15 μm-3 μm, and the distance between the boundary of the third opening H31 and the boundary of the fourth opening H41 is 0.15 μm-3 μm. Because the fourth opening H41 and fully overlaps with the second opening H21, in FIG. 9, the foam 106 with the third opening H31 expands inwardly by 0.15 μm-3 μm relative to the flexible heat dissipating layer 107 with the fourth opening H41 and the rigid heat dissipating layer 104 with the second opening H21; and the grid glue 102 with the first opening H11 expands inwardly by 0.15 μm-3 μm relative to the foam 106 with the third opening H31, and expands inwardly by 0.3 μm-6 μm relative to the flexible heat dissipating layer 107 with the fourth opening H41 and the rigid heat dissipating layer 104 with the second opening H21.

Specifically, as shown in FIG. 10, the distance between the boundary of the first opening H11 and the boundary of the third opening H31 is 0.15 μm-3 μm. Because the third opening H31 fully overlaps with the fourth opening H41 and the second opening H21, in FIG. 10, the grid glue 102 with the first opening H11 expands inwardly by 0.15 μm-3 μm relative to the foam 106 with the third opening H31, the flexible heat dissipating layer 107 with the fourth opening H41 and the rigid heat dissipating layer 104 with the second opening H21.

Optionally, in the above display device provided by embodiments of the disclosure, as shown in FIG. 11 to FIG. 16, the photosensitive module 105 may directly cover the second opening H21 and is in direct contact with a side of the rigid heat dissipating layer 104 facing away from the grid glue 103. That is, the photosensitive module 105 is in a regular shape as a whole, for example, a strip shape as shown in FIG. 11 to FIG. 16.

Or, as shown in FIG. 5 to FIG. 10, the photosensitive module 105 not only directly covers the second opening H21 and is in direct contact with the side of the rigid heat dissipating layer 104 facing away from the grid glue 103, but also is at least arranged in the second opening H21. Through arrangement of the photosensitive module 105 in a special shape, the photosensitive module 105 is at least matched in a stepped type with the rigid heat dissipating layer 104, so influence of external ambient light on the photosensitive module 105 is reduced.

Further, in the above display device provided by embodiments of the disclosure, as shown in FIG. 5 to FIG. 7 and in FIG. 9 to FIG. 10, the photosensitive module 105 is further arranged in a space between the first opening H11 and the second opening H21, and the space is larger than the first opening H11 and smaller than or equal to the second opening H21. Specifically, the space in FIG. 5 and FIG. 6 is the fourth opening H41, and the space in FIG. 7, FIG. 9 and FIG. 10 consists of the third opening H31 and the fourth opening H41. In this case, the photosensitive module 105 is matched in a stepped type with the rigid heat dissipating layer 104, the flexible heat dissipating layer 107, and the foam 106, so the influence of the external ambient light on the photosensitive module 105 is reduced, and the assembly of the photosensitive module 105 is further facilitated, so cooperative stress between the photosensitive module 105 and the rigid heat dissipating layer 104, the flexible heat dissipating layer 107, and the foam 106 is reduced, thereby optimizing product stamping.

It needs to be noted, theoretically, parts of the photosensitive module 105 located in the second opening H21, the third opening H31 and the fourth opening H41 are closely attached to the rigid heat dissipating layer 104, the flexible heat dissipating layer 107, and the foam 106. In a practical product, because of matching degree, assembly process or other factors between the photosensitive module 105 and the rigid heat dissipating layer 104, the flexible heat dissipating layer 107, and the foam 106, some gaps exist between the photosensitive module 105 and the rigid heat dissipating layer 104, the flexible heat dissipating layer 107, and the foam 106.

Optionally, in the above display device provided by embodiments of the disclosure, the display panel further includes: a first signal line extending in the first direction X, and a second signal line extending in the second direction Y.

An orthographic projection, on the plane where the cover plate 102 is located, of the first signal line to which the first camera region a, the second camera region b, the function integrating region c and the ambient light sensing region d correspond encircles the boundary of the orthographic projection of the second openings H21, H22, H23 and H24 in the first direction X.

An orthographic projection, on the plane where the cover plate 102 is located, of the second signal line to which the first camera region a, the second camera region b, the function integrating region c and the ambient light sensing region d correspond encircles the boundary of the orthographic projection of the second openings H21, H22, H23 and H24 in the second direction Y.

In the openings in the grid glue 103, the foam 106, the flexible heat dissipating layer 107, and the rigid heat dissipating layer 104, the second openings H21, H22, H23 and H24 are the largest on the rigid heat dissipating layer 104 to which the same region corresponds. Through the above arrangement manner of the signal fines, it may be realized that the signal line on the display panel 101 to which a region around the first camera region a, the second camera region h, the function integrating region c and the ambient light sensing region d corresponds is arranged bypassing open regions, so influence on a light transmission rate of the open regions is avoided. Specifically, parts of the signal line bypassing the second openings H21, H22, H23 and H24 are matched with the shapes of the second openings H21, H22, H23 and H24. Exemplarily, the second opening H21 is rectangular, and the parts of the signal line bypassing the second openings H21, H22, H23 and H24 are in a shape of or similar to a shape of "[" or "-"; and the second opening H21 is circular, the parts of the signal line bypassing the second openings H21, H22, H23 and H24 are in an arc shape or similar to an arc shape.

Optionally, the above display device provided by embodiments of the disclosure, as shown in FIG. 5 to FIG. 16, further includes: a shading part 108 disposed between the display panel 101 and the cover plate 102.

The shading part 108 has a fifth opening H5 in each of the first camera region a, the second camera region b, the function integrating region c and the ambient light sensing region d, and an orthographic projection of the fifth openings H5 in the first camera region a and the second camera region b is located is located in the orthographic projection of the first through hole H01 and the second through hole H02 on the plane where the cover plate 102.

On the display panel 101, the signal lines are arranged in regions AA around the first through hole H01 and the second through hole H02. Specifically, a material of the signal lines is generally a metal with good electricity conductivity, and the metal is generally non-transmitting. Through the shading part 108 with the fifth openings H5, it may be ensured that light needed by the photosensitive module 105 is irradiated to the photosensitive module 105 through the fifth openings H5, and meanwhile, the signal lines around the through holes H0 may be shielded, so visualization of the signal lines is avoided, thereby optimizing a product appearance experience.

Specifically, a material of the shading part 108 may be printing ink, or other materials with shading property known to those of skill in the art. Specially, the printing ink to which the IR sensor corresponds is IR printing ink. Infrared light ray emitted by a human body may penetrate through the IR printing ink while ultraviolet ray and visible light are shielded.

The above display device provided by embodiments of the disclosure includes: the first camera region, configured to install the first camera; the second camera region, arranged in parallel with the first camera region along the first direction and configured to install the second camera therein; the function integrating region, disposed between the first camera region and the second camera region and configured to install the plurality of functional modules therein; the ambient light sensing region, arranged in parallel with the function integrating region along the second direction and configured to install the ambient light sensor therein, wherein the second direction intersects with the first direction; the display panel, including the first through hole located in the first camera region, the second through hole located in the second camera region, and the non-display region between the first through hole and the second through hole; the cover plate, disposed on the display side of the display panel; the grid glue, located on the side of the display panel facing away from the cover plate, wherein the grid glue has the first opening in each of the first camera region, the second camera region, the function integrating region and the ambient light sensing region, and the orthographic projection of the first openings in the first camera region and the second camera region on the plane where the cover plate is located fully covers and has an area greater than the orthographic projection of the first through hole and the second through hole; the rigid heat dissipating layer, located on the side of the grid glue facing away from the display panel, wherein the rigid heat dissipating layer has the second opening in each of the first camera region, the second camera region, the function integrating region and the ambient light sensing region, and the orthographic projection of the second openings on the plane where the cover plate is located fully covers and has an area greater than the orthographic projection of the first openings; and the photosensitive module, located on the side of the rigid heat dissipating layer facing away from the grid glue, wherein the orthographic projection of the photosensitive module on the plane where the cover plate is located fully covers and has the area greater than the orthographic projection of the first openings and the second openings.

The orthographic projection of the second opening of the rigid heat dissipating layer on the plane where the cover plate is located fully covers and has the area greater than the orthographic projection of the first opening of the grid glue, that is, the grid glue expands inwardly relative to the rigid heat dissipating layer. Specifically, the grid glue is closer to centers of the through holes of the display panel relative to the rigid heat dissipating layer. Because the grid glue itself has shading property, the inwardly expanded grid glue may effectively shield the light in the region AA around the through holes of the display panel, thereby reducing the influence of light leakage of the display panel on the performance of the photosensitive module.

Obviously, those of skill in the art can make various changes and modifications to the disclosure without departing from the spirit and scope of the disclosure. In this case, provided that these changes and modifications of the disclosure fall within the scope of the claims of the disclosure and their equivalents, the disclosure is also intended to cover these changes and modifications.

What is claimed is:

1. A display device, comprising:
   a first camera region, configured to install a first camera therein;
   a second camera region, arranged in parallel with the first camera region along a first direction and configured to install a second camera therein;
   a function integrating region, located between the first camera region and the second camera region and configured to install a plurality of functional modules therein;
   an ambient light sensing region, arranged in parallel with the function integrating region along a second direction and configured to install an ambient light sensor therein, wherein the second direction intersects with the first direction;
   a display panel, comprising a first through hole located in the first camera region, a second through hole located in the second camera region, and a non-display region between the first through hole and the second through hole;
   a cover plate, disposed on a display side of the display panel;
   a grid glue, disposed on a side of the display panel facing away from the cover plate, wherein the grid glue has a first opening in each of the first camera region, the second camera region, the function integrating region and the ambient light sensing region; and in the first camera region, an orthographic projection of the first opening on a plane where the cover plate is located fully covers and has an area greater than an orthographic projection of the first through hole on a plane where the cover plate is located; in the second camera region, an orthographic projection of the first opening on a plane where the cover plate is located fully covers and has an area greater than an orthographic projection of the second through hole on a plane where the cover plate is located;
   a rigid heat dissipating layer, disposed on a side of the grid glue facing away from the display panel, wherein the rigid heat dissipating layer has a second opening in each of the first camera region, the second camera region, the function integrating region and the ambient light sensing region; and in each of the first camera region, the second camera region, the function integrating region and the ambient light sensing region, an orthographic projection of the second opening on the plane where the cover plate is located fully covers and has an area greater than the orthographic projection of the first opening; and
   a photosensitive module, disposed on a side of the rigid heat dissipating layer facing away from the grid glue, wherein an orthographic projection of the photosensitive module on the plane where the cover plate is located fully covers and has an area greater than the orthographic projections of the first opening and the second opening.

2. The display device according to claim 1, wherein the first opening and the second opening in each of the first camera region and the second camera region is circular.

3. The display device according to claim 2, wherein a distance between a boundary of an orthographic projection of the first opening in a circle on the plane where the cover plate is located and a boundary of an orthographic projection of the second opening in a circle is 0.15 μm-3 μm.

4. The display device according claim 1, wherein the first opening in the function integrating region is in a shape of a Chinese character '凸', and the second opening in the function integrating region is rectangular.

5. The display device according to claim 4, wherein two boundaries of an orthographic projection of the second opening in a rectangle in the second direction, on the plane where the cover plate is located align with two boundaries of an orthographic projection of the first opening in the shape of Chinese character '凸' close to the ambient light sensing region and in the second direction, and a distance between the two boundaries of the orthographic projection of the rectangle and two boundaries of the orthographic projection of the first opening in the shape of Chinese character '凸' in the second direction and away from the ambient light sensing region, is 0.15 μm-3 μm;
   a distance between an orthographic projection of an edge, away from a side of the ambient light sensing region in the first direction, of the second opening in the rectangle on the plane where the cover plate is located and an orthographic projection of an edge of the first opening in the shape of Chinese character '凸' on the plane where the cover plate is located, away from the side of the ambient light sensing region in the first direction, is 0.15 μm-3 μm; and
   an orthographic projection of an edge of the second opening in the rectangle close to the side of the ambient light sensing region in the first direction on the plane where the cover plate is located, aligns with an orthographic projection of an edge of the first opening in the shape of Chinese character '凸' close to the side of the ambient light sensing region in the first direction on the plane where the cover plate is located.

6. The display device according to claim 1, wherein the first opening and the second opening in the ambient light sensing region are rectangular.

7. The display device according to claim 6, wherein a distance between a boundary of an orthographic projection of the first opening in a rectangle on the plane where the cover plate is located and a boundary of an orthographic projection of the second opening in a rectangle on the plane where the cover plate is located is 0.15 μm-3 μm.

8. The display device according to claim 1, further comprising: a foam located between the grid glue and the rigid heat dissipating layer; wherein the foam has a third opening in each of the first camera region, the second camera region, the function integrating region and the ambient light sensing region; and an orthographic projection of the third opening on the plane where the cover plate is located fully overlaps with the orthographic projection of the first opening on the plane where the cover plate is located.

9. The display device according to claim 8, further comprising: a flexible heat dissipating layer located between the foam and the rigid heat dissipating layer; wherein the flexible heat dissipating layer has a fourth opening in each of the first camera region, the second camera region, the function integrating region and the ambient light sensing region; and an orthographic projection of the fourth opening on the plane where the cover plate is located fully overlaps with the orthographic projection of the second opening on the plane where the cover plate is located.

10. The display device according to claim 1, wherein the photosensitive module covers the second opening and is in direct contact with a side of the rigid heat dissipating layer facing away from the grid glue.

11. The display device according to claim 10, wherein the photosensitive module is further arranged in the second opening and in a space between the second opening and the first opening; wherein the space is larger than the first opening and smaller than or equal to the second opening.

12. The display device according to claim 1, wherein the display panel to which the function integrating region corresponds comprises: a first gate insulating layer, a second gate insulating layer, an interlayer dielectric layer, a planarization layer, a light emitting layer and a cathode encapsulation layer which are arranged in stack.

13. The display device according to claim 1, wherein the display panel to which the function integrating region corresponds comprises: a driving circuit, an anode, a light-emitting functional layer, a cathode and an encapsulation layer which are arranged in stack.

14. The display device according to claim 1, wherein the display panel further comprises: a first signal line extending in the first direction, and a second signal line extending in the second direction; wherein on the plane where the cover plate is located, an orthographic projection of the first signal line to which the first camera region, the second camera region, the function integrating region and the ambient light sensing region correspond bypasses an orthographic projection of the second opening in the first camera region, the second camera region, the function integrating region and the ambient light sensing region in the first direction; and on the plane where the cover plate is located, an orthographic projection of the second signal line to which the first camera region, the second camera region, the function integrating region and the ambient light sensing region correspond bypasses the orthographic projection of the second opening in the second direction in the first camera region, the second camera region, the function integrating region and the ambient light sensing region.

15. The display device according to claim 1, further comprising: a shading part located between the display panel and the cover plate; wherein the shading part has a fifth opening in each of the first camera region, the second camera region, the function integrating region and the ambient light sensing region; and an orthographic projection of the fifth opening in the first camera region on the plane where the cover plate is located is located within the orthographic projection of the first through hole, and an orthographic projection of the fifth opening in the second camera region on the plane where the cover plate is located is located within the orthographic projection of the second through hole.

\* \* \* \* \*